United States Patent
Luan et al.

(10) Patent No.: US 10,438,952 B2
(45) Date of Patent: Oct. 8, 2019

(54) METHOD OF WRITING INTO AND REFRESHING A THYRISTOR VOLATILE RANDOM ACCESS MEMORY

(71) Applicant: Kilopass Technology, Inc., San Jose, CA (US)

(72) Inventors: Harry Luan, Saratoga, CA (US);
Bruce L. Bateman, Fremont, CA (US);
Valery Axelrad, Woodside, CA (US);
Charlie Cheng, Los Altos, CA (US)

(73) Assignee: TC Lab, Inc., Gilroy, CA (US)

( * ) Notice: Subject to any disclaimer, the term of this patent is extended or adjusted under 35 U.S.C. 154(b) by 0 days.

(21) Appl. No.: 15/658,346

(22) Filed: Jul. 24, 2017

(65) Prior Publication Data
US 2017/0323891 A1 Nov. 9, 2017

Related U.S. Application Data

(63) Continuation of application No. 14/841,140, filed on Aug. 31, 2015, now abandoned, which is a (Continued)

(51) Int. Cl.
*G11C 11/39* (2006.01)
*H01L 27/102* (2006.01)
(Continued)

(52) U.S. Cl.
CPC .......... *H01L 27/1027* (2013.01); *G11C 11/39* (2013.01); *H01L 21/28035* (2013.01); *H01L 21/321* (2013.01); *H01L 21/324* (2013.01); *H01L 21/76224* (2013.01); *H01L 28/00* (2013.01); *H01L 29/0649* (2013.01); *H01L 29/102* (2013.01); *H01L 29/1016* (2013.01); *H01L 29/16* (2013.01); *H01L 29/45* (2013.01); *H01L 29/456* (2013.01); *H01L 29/66356* (2013.01); *H01L 29/66363* (2013.01); *H01L 29/749* (2013.01); *H01L 29/0834* (2013.01); *H01L 29/4236* (2013.01)

(58) Field of Classification Search
CPC . H01L 27/1027; H01L 29/456; H01L 21/321;
H01L 21/28035; H01L 29/66356; H01L 29/45; H01L 29/102; H01L 29/66363; H01L 21/324; H01L 21/76224; H01L 29/0649; H01L 29/16; H01L 29/1016; H01L 29/749; H01L 29/0834; H01L 29/4236; G11C 11/39
USPC .......................................................... 365/71
See application file for complete search history.

(56) References Cited

U.S. PATENT DOCUMENTS 4,400,712 A 8/1983 O'connor
4,598,390 A 7/1986 Chan
(Continued)

FOREIGN PATENT DOCUMENTS

EP 066429 12/1982

OTHER PUBLICATIONS

X. Tong et al. ECS Transactions, 58 (25) 1-6 (2014).*
(Continued)

*Primary Examiner* — Jerome Leboeuf
(74) *Attorney, Agent, or Firm* — Aka Chan LLP

(57) ABSTRACT

A method of writing data into a volatile thyristor memory cell array and maintaining the data with refresh is disclosed.

4 Claims, 19 Drawing Sheets

Related U.S. Application Data continuation-in-part of application No. 14/590,834, filed on Jan. 6, 2015, now Pat. No. 9,449,669.

(60) Provisional application No. 62/186,336, filed on Jun. 29, 2015, provisional application No. 62/055,582, filed on Sep. 25, 2014.

(51) Int. Cl.

| | |
|---|---|
| H01L 29/749 | (2006.01) |
| H01L 29/66 | (2006.01) |
| H01L 29/10 | (2006.01) |
| H01L 29/16 | (2006.01) |
| H01L 29/06 | (2006.01) |
| H01L 21/762 | (2006.01) |
| H01L 21/324 | (2006.01) |
| H01L 21/28 | (2006.01) |
| H01L 21/321 | (2006.01) |
| H01L 29/45 | (2006.01) |
| H01L 49/02 | (2006.01) |
| H01L 29/423 | (2006.01) |
| H01L 29/08 | (2006.01) |

(56) References Cited

U.S. PATENT DOCUMENTS

| | | | |
|---|---|---|---|
| 4,754,430 A | 6/1988 | Hobbs | |
| 4,769,785 A | 9/1988 | Guo | |
| 4,794,561 A | 12/1988 | Hsu | |
| 4,858,181 A | 8/1989 | Scharrer et al. | |
| 5,163,022 A | 11/1992 | Homma | |
| 5,204,541 A | 4/1993 | Samyling et al. | |
| 5,289,409 A | 2/1994 | Reinschmidt | |
| 5,981,335 A | 11/1999 | Chi | |
| 6,026,042 A | 2/2000 | Shirley et al. | |
| 6,225,165 B1 | 5/2001 | Noble, Jr. | |
| 6,229,161 B1 | 5/2001 | Nemati | |
| 6,295,241 B1 | 9/2001 | Watanabe et al. | |
| 6,556,471 B2 | 4/2003 | Chappell et al. | |
| 6,703,646 B1 | 3/2004 | Nemati | |
| 6,933,541 B1 | 8/2005 | Huang | |
| 6,944,051 B1 | 9/2005 | Lee | |
| 6,958,931 B1 | 10/2005 | Yoon et al. | |
| 7,081,378 B2 | 7/2006 | Zheng et al. | |
| 7,157,342 B1 | 1/2007 | Tarabbia | |
| 7,279,367 B1 | 10/2007 | Horch et al. | |
| 7,319,622 B1* | 1/2008 | Roy | G11C 5/025 |
| | | | 365/189.02 |
| 7,324,394 B1 | 1/2008 | Yoon et al. | |
| 7,456,439 B1 | 11/2008 | Horch | |
| 7,474,583 B2 | 1/2009 | Yamamura | |
| 7,738,274 B1 | 6/2010 | Nemati et al. | |
| 7,786,505 B1 | 8/2010 | Yang et al. | |
| 7,893,456 B1 | 2/2011 | Nemati et al. | |
| 7,894,225 B2 | 2/2011 | Nemati | |
| 7,969,777 B1 | 6/2011 | Cho et al. | |
| 8,035,126 B2 | 10/2011 | Nguyen et al. | |
| 8,093,107 B1 | 1/2012 | Nemati | |
| 8,441,881 B1 | 5/2013 | Nemati | |
| 8,519,431 B2 | 8/2013 | Nemati et al. | |
| 8,576,607 B1 | 11/2013 | Nemati | |
| 8,630,113 B1 | 1/2014 | Xu et al. | |
| 8,837,204 B2 | 9/2014 | Asa | |
| 2001/0002062 A1 | 5/2001 | Noble, Jr. et al. | |
| 2002/0033516 A1 | 3/2002 | Choi et al. | |
| 2002/0036327 A1 | 3/2002 | Fazan et al. | |
| 2002/0045301 A1 | 4/2002 | Sicard et al. | |
| 2002/0190265 A1 | 12/2002 | Hsu et al. | |
| 2002/0191476 A1 | 12/2002 | Kojima | |
| 2004/0056270 A1 | 3/2004 | Hsu et al. | |
| 2005/0167786 A1 | 8/2005 | Gill | |
| 2006/0011940 A1 | 1/2006 | Nemati et al. | |
| 2007/0012945 A1* | 1/2007 | Sugizaki | H01L 21/84 |
| | | | 257/124 |
| 2007/0189067 A1 | 8/2007 | Goodwin | |
| 2007/0300100 A1 | 12/2007 | Foss | |
| 2008/0104481 A1 | 5/2008 | Ito | |
| 2008/0239803 A1 | 10/2008 | Cho | |
| 2008/0279017 A1 | 11/2008 | Shimano et al. | |
| 2009/0108287 A1 | 4/2009 | Nguyen | |
| 2009/0121296 A1 | 5/2009 | Kwon et al. | |
| 2009/0213648 A1 | 8/2009 | Slesazeck | |
| 2010/0232200 A1 | 9/2010 | Shepard | |
| 2010/0246277 A1 | 9/2010 | Widjaja et al. | |
| 2010/0312996 A1 | 12/2010 | Bruno et al. | |
| 2010/0315871 A1 | 12/2010 | Nemati et al. | |
| 2011/0116300 A1 | 5/2011 | Maejima | |
| 2011/0121744 A1 | 5/2011 | Salvestrini et al. | |
| 2011/0249499 A1 | 10/2011 | Fisch et al. | |
| 2011/0299327 A1 | 12/2011 | Asa | |
| 2012/0140546 A1 | 6/2012 | Scheuerleing | |
| 2012/0256292 A1 | 10/2012 | Yu et al. | |
| 2012/0314472 A1 | 12/2012 | Chung | |
| 2012/0314485 A1 | 12/2012 | Cai | |
| 2013/0083613 A1 | 4/2013 | Phan et al. | |
| 2013/0163330 A1 | 6/2013 | Sharon | |
| 2013/0228855 A1 | 9/2013 | Molin et al. | |
| 2013/0322194 A1 | 12/2013 | Rachamadugu et al. | |
| 2013/0323887 A1* | 12/2013 | Tang | H01L 27/1027 |
| | | | 438/135 |
| 2014/0104926 A1 | 4/2014 | Sutardja et al. | |
| 2014/0117454 A1 | 5/2014 | Liu et al. | |
| 2014/0153346 A1 | 6/2014 | Roy et al. | |
| 2014/0160871 A1 | 6/2014 | Zimmer et al. | |
| 2014/0167101 A1 | 6/2014 | Bobde et al. | |
| 2014/0191295 A1 | 7/2014 | Greene et al. | |
| 2014/0269018 A1 | 9/2014 | Jin et al. | |
| 2014/0269046 A1 | 9/2014 | Laurin et al. | |
| 2015/0179649 A1 | 6/2015 | Tang | |
| 2015/0339068 A1 | 11/2015 | Gary et al. | |

OTHER PUBLICATIONS

International Search Report, PCT Application PCT/US2015/052499, dated Jan. 28, 2016, 6 pages.
Written Opinion, PCT Application PCT/US2015/052499, dated Jan. 28, 2016, 4 pages.
International Search Report (Corrected Version), PCT Application PCT/US2015/052468, dated Jan. 27, 2016, 10 pages.
International Search Report, PCT Application PCT/US2015/052493, dated Jan. 7, 2016, 7 pages.
International Search Report, PCT Application PCT/US2015/052480, dated Feb. 10, 2016, 5 pages.
International Search Report, PCT Application PCT/US2015/052488, dated Jan. 31, 2016, 12 pages.
International Search Report, PCT Application PCT/US2015/052497, dated Jan. 28, 2016, 11 pages.
Jutzi, et al., "Cross-Coupled Thyristor Storage Cell," IBM J. Res. Develop., Jan. 1972, pp. 35-44.
Sugizaki, et al., "Ultra High-Speed Novel Bulk Thyristor-sRAM (BT-RAM) Cell with Selective Epitaxy Anode (SEA)," Sony Corporation, Japan, 4 pages.
Tong, et al., "Two-Terminal Vertical Memory Cell for Cross-Point Static Random Access Memory Applications," J. Vac. Sci. Technol. B 32(2), Mar./Apr. 2014, 2014 American Vacuum Society, pp. 021205-1 to 021205-7.
Written Opinion (Corrected Version), PCT Application PCT/US2015/052468, dated Jan. 27, 2016, 8 pages.
Written Opinion, PCT Application PCT/US2015/052493, dated Jan. 7, 2016, 4 pages.
Written Opinion, PCT Application PCT/US2015/052480, dated Feb. 10, 2016, 8 pages.
Written Opinion, PCT Application PCT/US2015/052488, dated Jan. 31, 2016, 8 pages.
Written Opinion, PCT Application PCT/US2015/052497, dated Jan. 28, 2016, 13 pages.

(56) References Cited

OTHER PUBLICATIONS

International Search Report, PCT Application PCT/US2015/052505, dated Jan. 27, 2016, 8 pages.
Written Opinion, PCT Application PCT/US2015/052505, dated Jan. 27, 2016, 3 pages.
International Search Report, PCT Application PCT/US2015/052507, dated Feb. 2, 2016, 5 pages.
Written Opinion, PCT Application PCT/US2015/052507, dated Feb. 2, 2016, 3 pages

* cited by examiner

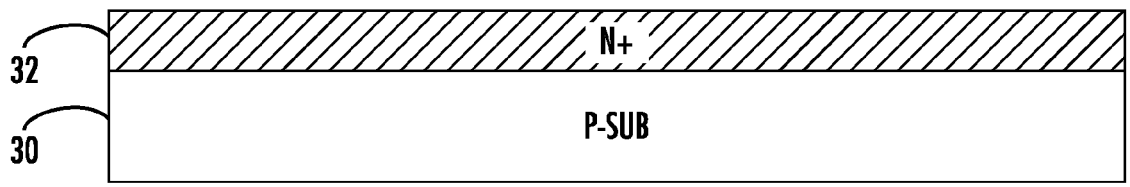
FIG. 3A (A~A')
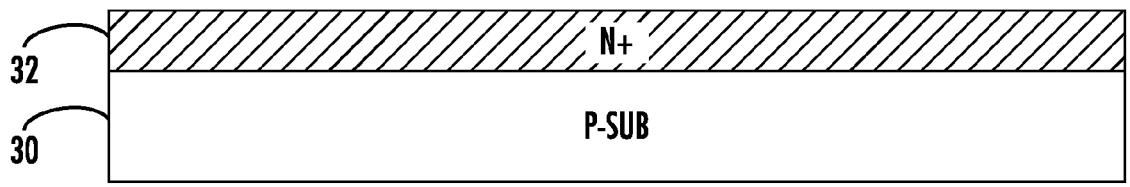
FIG. 3B (B~B')
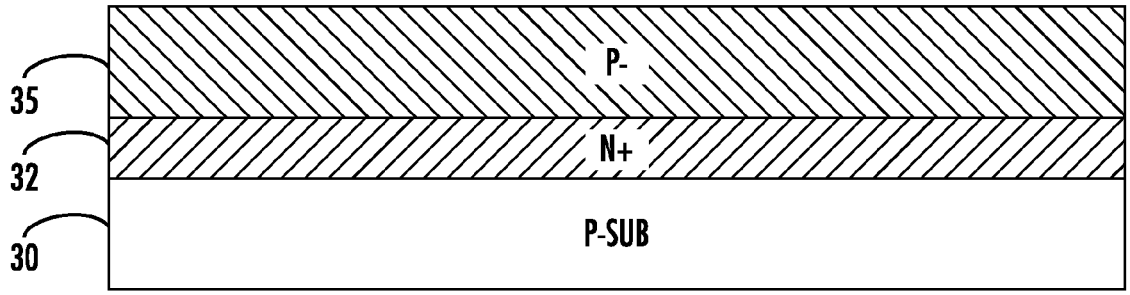
FIG. 4A (A~A')
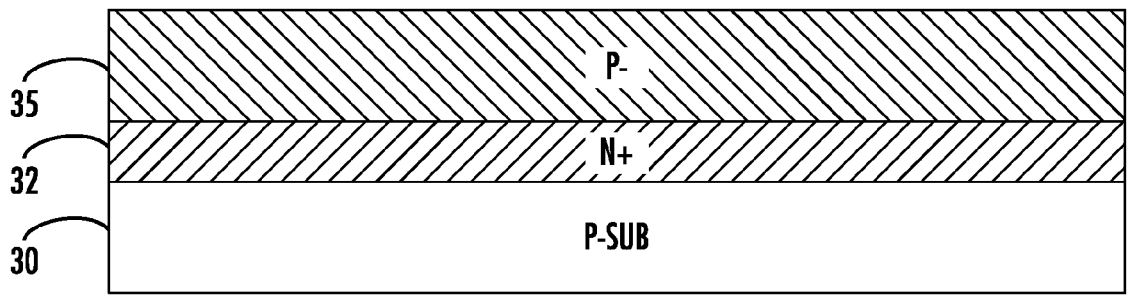
FIG. 4B (B~B')

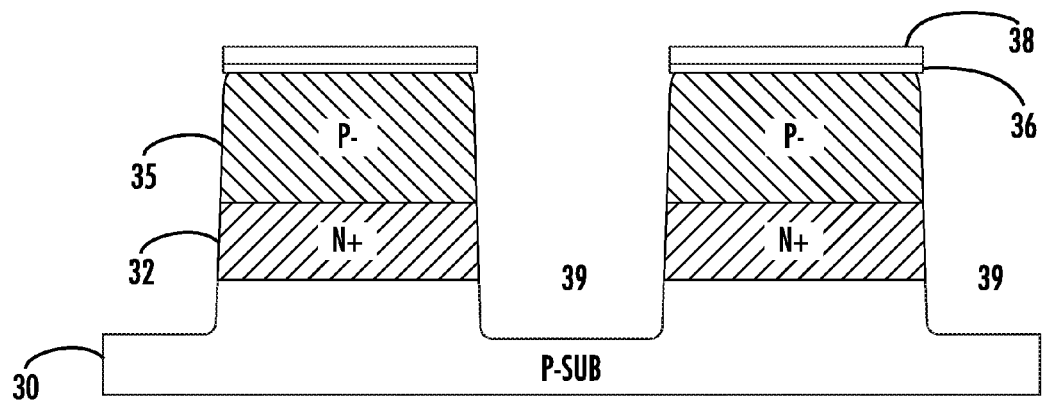
FIG. 5A (A~A')
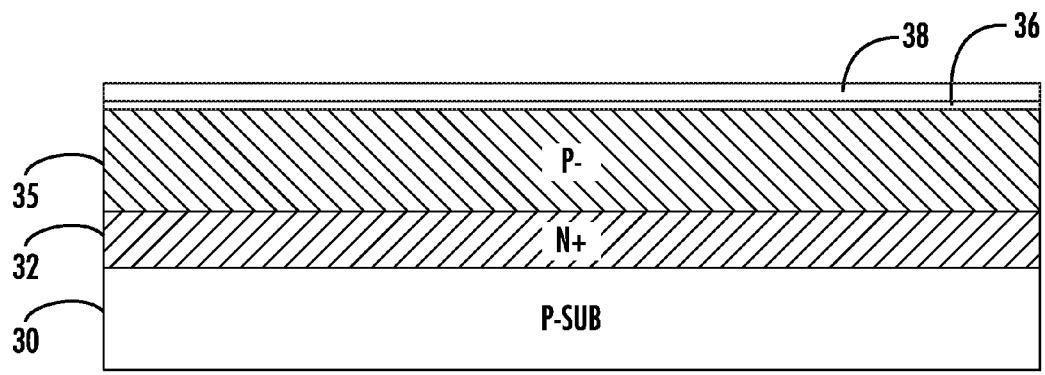
FIG. 5B (B~B')

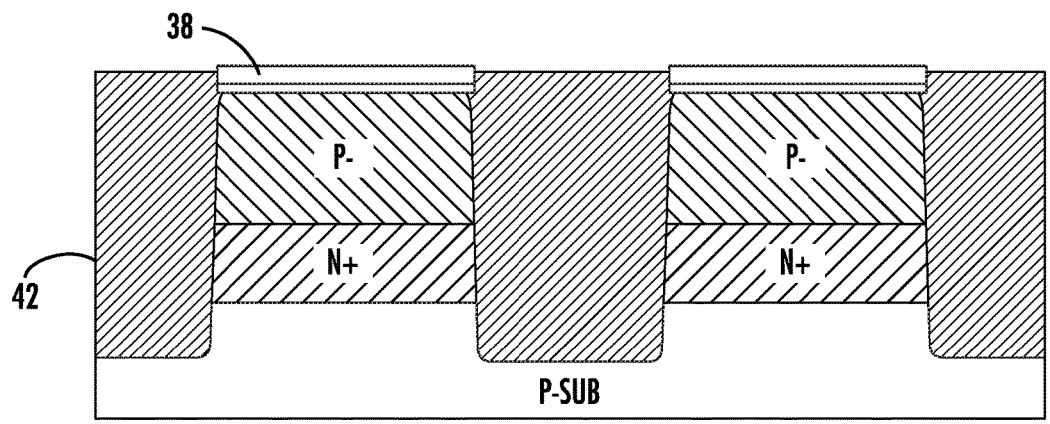
FIG. 6A (A~A')
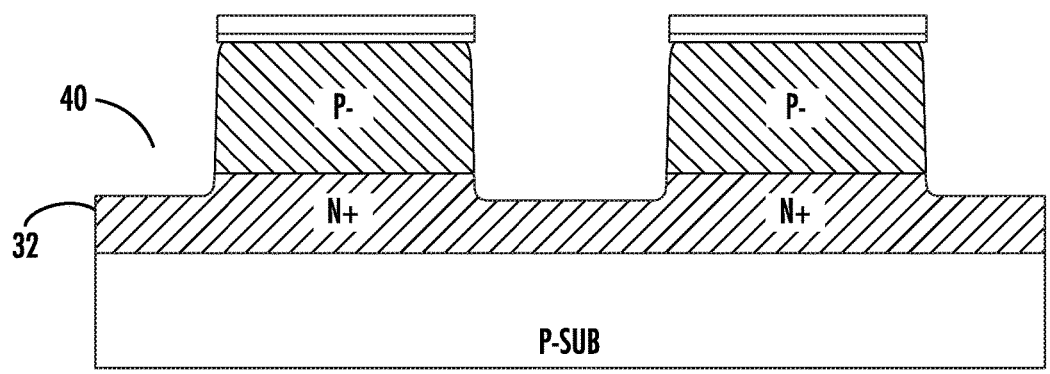
FIG. 6B (B~B')

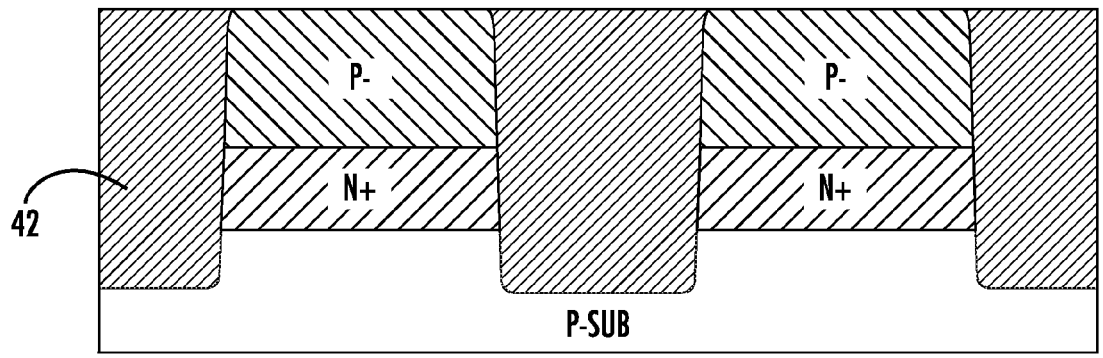
FIG. 7A (A~A')
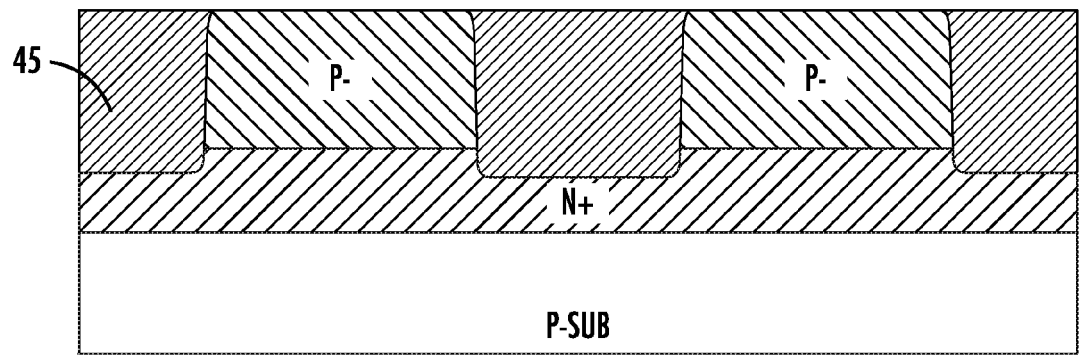
FIG. 7B (B~B')

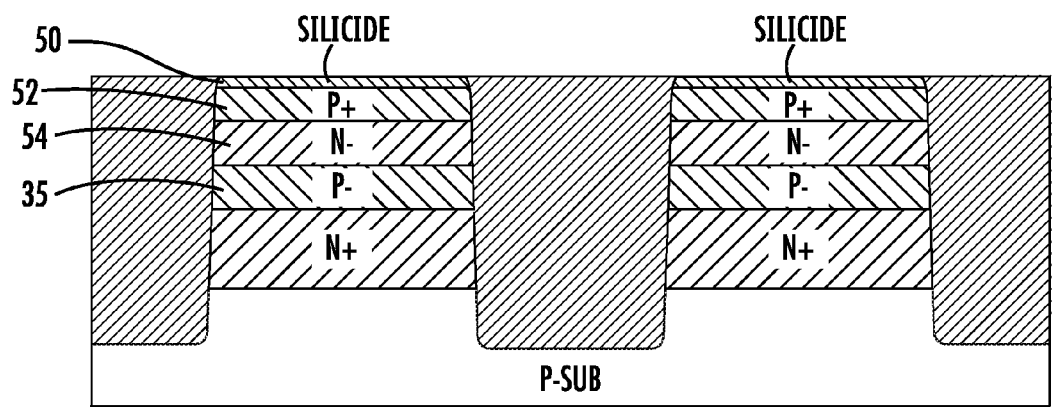
FIG. 8A (A~A')
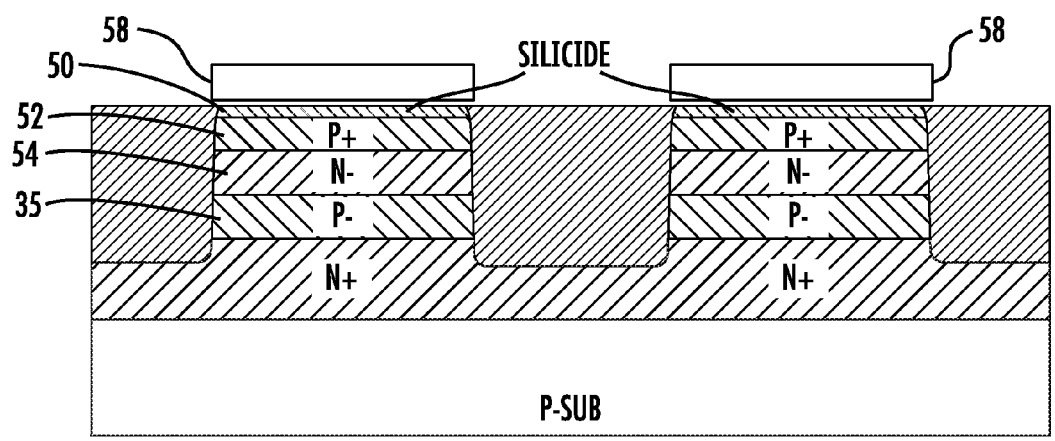
FIG. 8B (B~B')

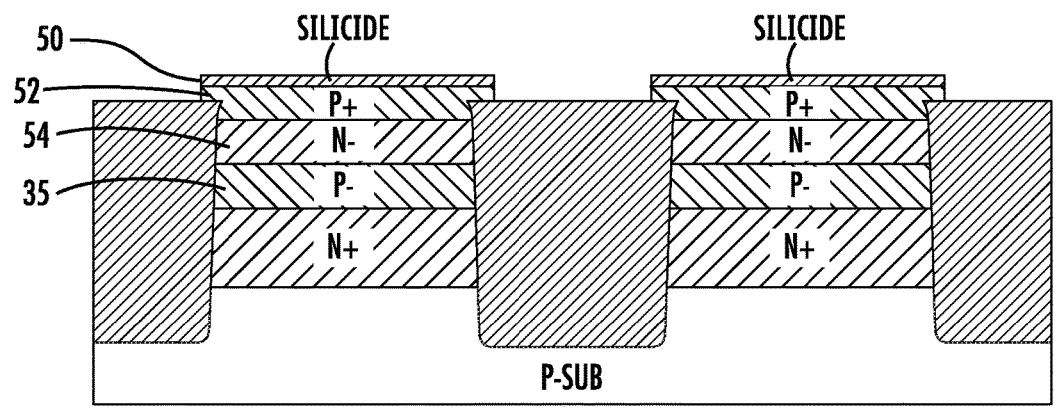
FIG. 9A (A~A')
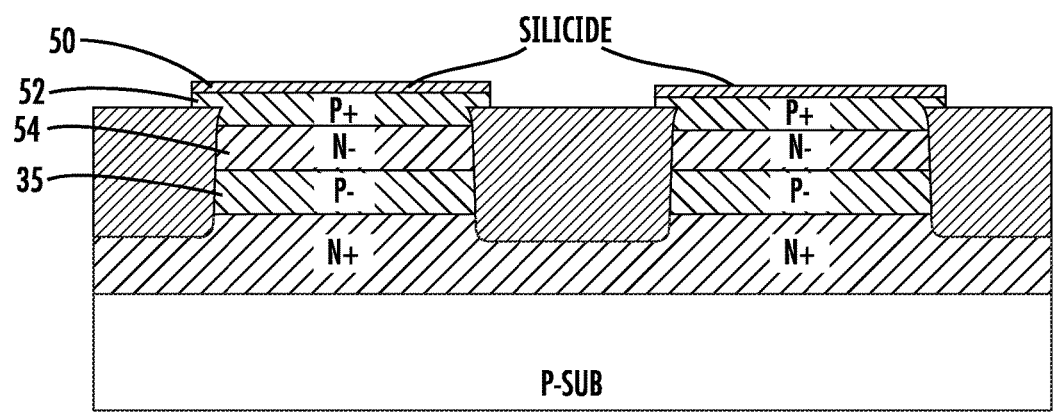
FIG. 9B (B~B')

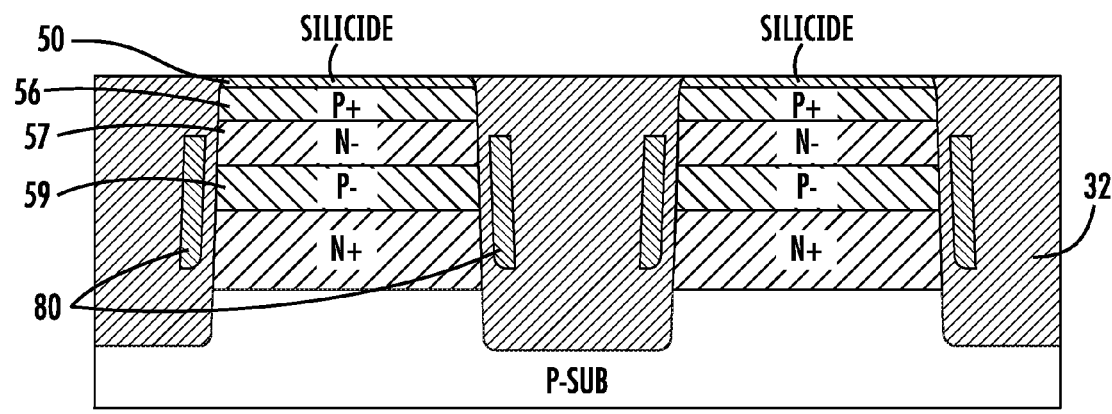
FIG. 15A (A~A')
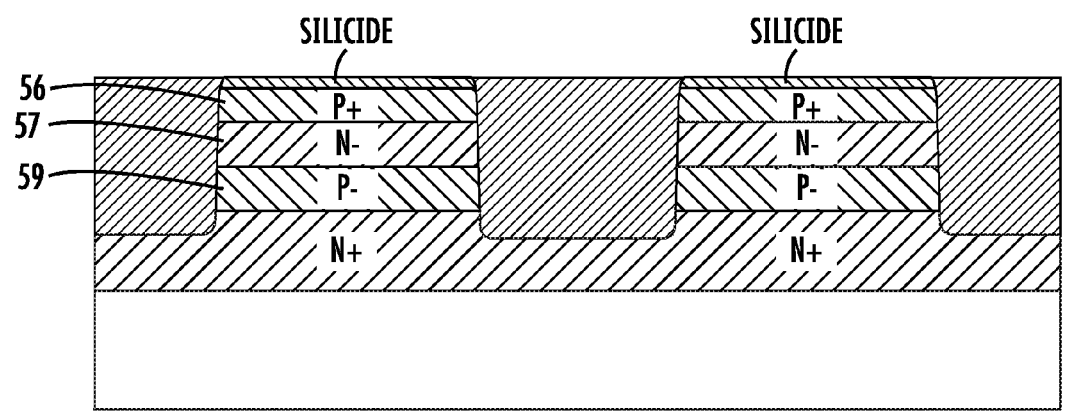
FIG. 15B (B~B')

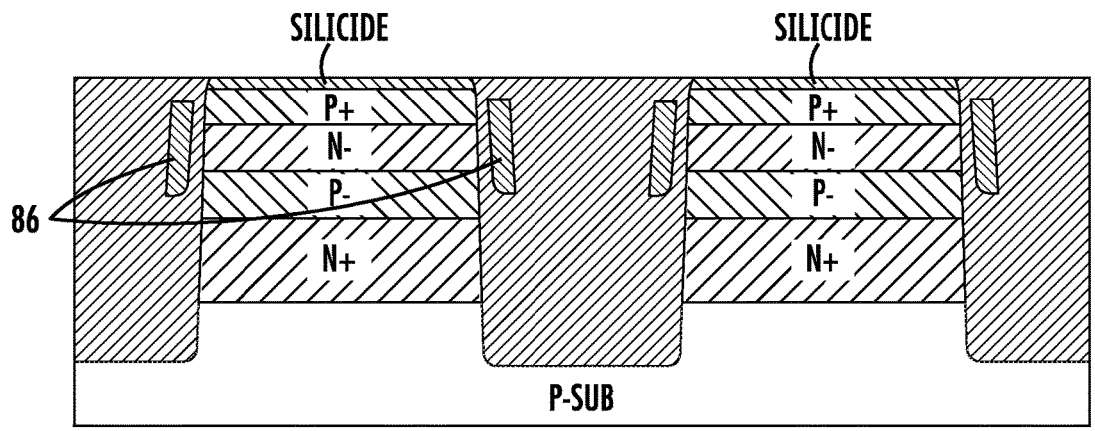
FIG. 17A (A~A')
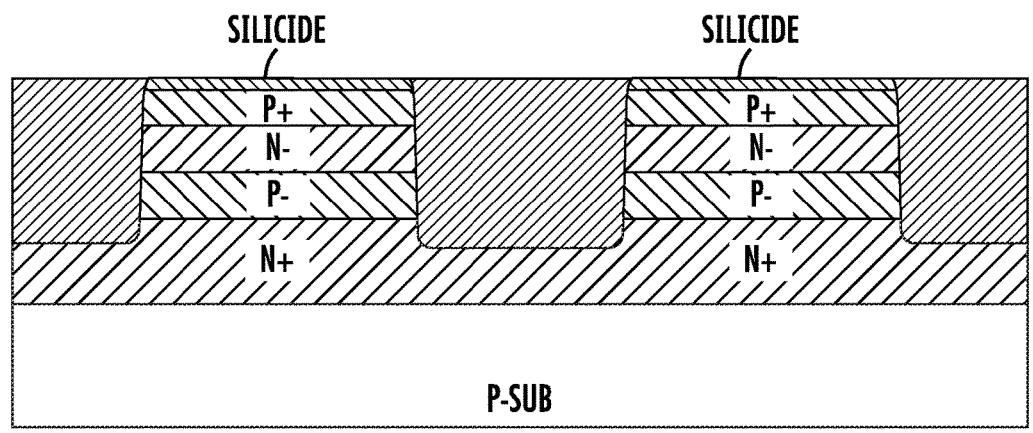
FIG. 17B (B~B')

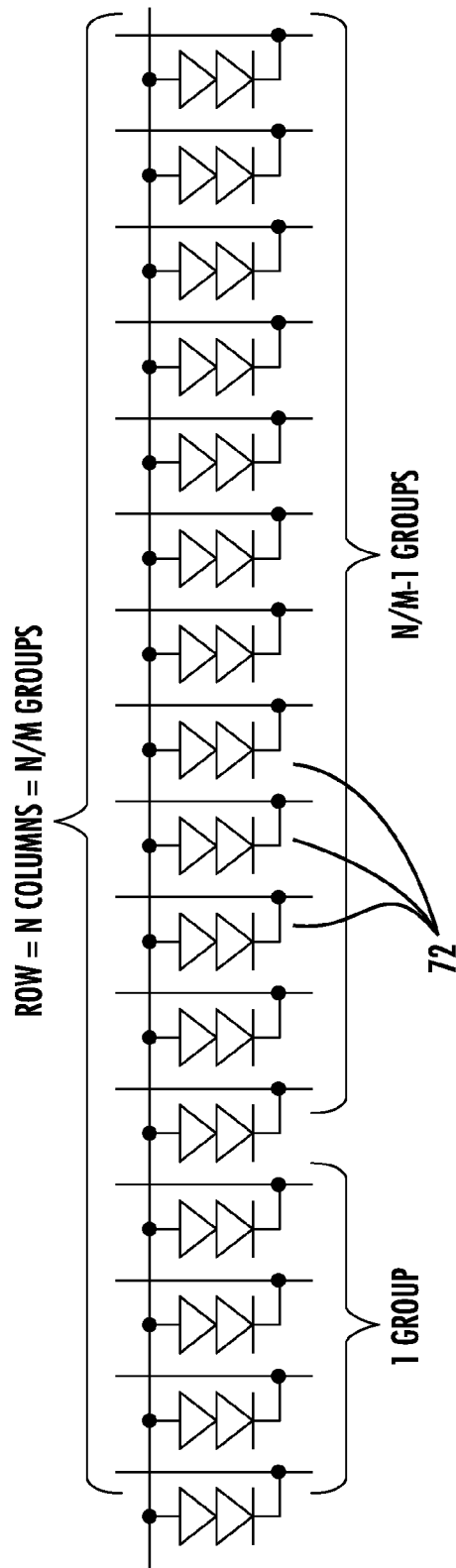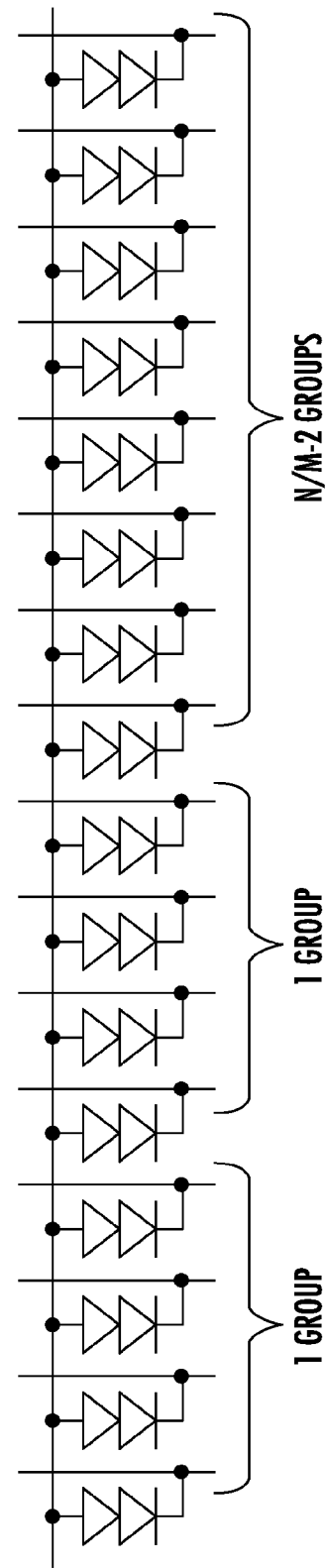

METHOD OF WRITING INTO AND REFRESHING A THYRISTOR VOLATILE RANDOM ACCESS MEMORY

CROSS-REFERENCE TO RELATED APPLICATIONS

This patent application is a continuation of U.S. patent application Ser. No. 14/841,140, filed Aug. 31, 2015, which is related to U.S. patent application Ser. No. 14/841,521, filed of even date and entitled, "Methods of Reading and Writing Data in a Thyristor Random Access Memory," U.S. patent application Ser. No. 14/841,578, filed of even date and entitled, "Methods of Retaining and Refreshing Data in a Thyristor Random Access Memory," U.S. patent application Ser. No. 14/841,615, filed of even date and entitled, "Power Reduction in Thyristor Random Access;" all of which claim priority from U.S. Provisional Patent Application No. 62/186,336, filed Jun. 29, 2015 and entitled, "High-Density Volatile RAMs, Method of Operation and Manufacture Thereof," and is a continuation-in part of U.S. application Ser. No. 14/590,834, filed Jan. 6, 2015 and entitled, "Cross-Coupled Thyristor SRAM Circuits and Methods of Operation," issued as U.S. Pat. No. 9,449,669 on Sep. 20, 2016, which claims priority from U.S. Provisional Patent Application No. 62/055,582, filed Sep. 25, 2014; all of which are incorporated by reference herein for all purposes.

BACKGROUND OF THE INVENTION

This invention is related to integrated circuit devices and in particular to volatile random access memories, commonly known as dynamic random access memories (DRAMs).

A DRAM is a type of random-access memory integrated circuit that in the most common commercial implementation stores each bit of data in a separate capacitor coupled to a transistor within the integrated circuit. The capacitor can be either charged or discharged. The states of charged or discharged are interpreted as values of a bit, i.e. '0' and '1'. The one-transistor one-capacitor cell has been the most commercially used memory cell used in DRAM devices for the last 30 years. Lithographical scaling and increasing process complexity have enabled the number of bits of storage in a DRAM to quadruple about every three years, however the individual memory cells are now so small that maintaining the capacitance of each cell, and reducing charge leakage, are significant problems inhibiting further size reductions.

In response to these challenges and other problems, alternative DRAM memory cell architectures have been proposed. One such approach is known as a floating body DRAM (FBDRAM). The FBDRAM is a single MOSFET built on either a silicon-on-insulator (SOI) (Okhonin, Int. SOI Conf., 2001) or in a triple-well with a buried N-implant (Ranica, VLSI Technology, 2004). The transistor's body forms a capacitor against the insulated substrate. The technology has yet to solve its data retention issues, particularly at scaled dimensions.

Another approach to a new DRAM architecture is based on the negative differential resistance behavior of a PNPN thyristor. In these designs an active or passive gate is used. For example, a thin capacitively coupled thyristor described in U.S. Pat. No. 6,462,359 uses a lateral PNPN thyristor on a SOI substrate with a coupling gate for increased switching speed. Unfortunately, the lateral aspect of the design, together with the need for a gate, results in a memory cell substantially larger than a conventional one-transistor one-capacitor DRAM cell structure.

Liang in U.S. Pat. No. 9,013,918 describes a PNPN thyristor cell constructed on top of a silicon substrate and operated in forward and reverse breakdown region for writing data into the cell. Unfortunately, the use of epitaxial or CVD semiconductor layers at the backend of the standard CMOS process, adds thermal cycles and etching steps that can degrade performance and yield of other devices earlier formed on the same substrate. In addition, PNPN devices operated in the breakdown regime pose challenges in process control and power consumption.

What is needed is a DRAM memory cell smaller than the conventional one-transistor one-capacitor, that is easily scalable below 20 nm design rules, is compatible with standard bulk silicon processing, and consumes less power, both statically and dynamically.

BRIEF SUMMARY OF THE INVENTION

This invention provides a volatile memory array suitable for implementation of dynamic random access memories in which vertical PNPN thyristors are formed in bulk silicon substrate and isolated from each other by a shallow trench of insulating material in one direction and deeper trench of insulating material in a perpendicular direction. The array of memory cells is arranged in a cross-point grid and interconnected by metal conductors and buried heavily doped layers.

In one embodiment the memory array includes a row and column lines, and each thyristor has an anode connected to one of row lines and a cathode coupled to a column line. The substrate is preferably P-conductivity type with an N-conductivity type buried layer extending in a first direction to provide a column line and cathodes for the thyristors coupled to that column line. Alternating P-conductivity type and N-conductivity type layers on the buried layer provide the bases of the thyristor, with an upper P-conductivity type layer providing the anodes of the thyristors. A conductive layer coupled to the anodes of the thyristor extending in a second direction orthogonal to the first direction provides a row line. If desired gates are formed in the insulating material to provide NMOS and PMOS transistors for improving switching speed.

A method of making the array includes steps of introducing N-conductivity type dopant into a P-conductivity type semiconductor substrate to provide a buried layer to form the column lines and cathodes for the vertical thyristors. A P-conductivity type epitaxial layer is then formed on the buried layer. Etching then removes all of the epitaxial layer and the buried layer to expose portions of the substrate to form parallel deep trenches that are then filled with insulating material such as silicon dioxide. The epitaxial layer is then etched again to form shallower trenches perpendicular to the deep trenches. After filing the shallow trenches with insulating material the bases and anodes of the thyristor are doped and desired electrical contacts and connectors are formed.

A method of operating the memory array to program a selected thyristor 'on' includes steps of applying a positive potential to the row line to which the selected thyristor is connected and applying a lower potential to the column line to which the selected thyristor is connected a lower potential where the difference between the positive potential and the lower potential is greater than that required to turn on the thyristor. All of the non-selected lines have potentials applied to them insufficient to change the state of any other thyristors. To turn the selected thyristor off a low potential is applied to the row line and a positive potential is applied to the column line sufficient to turn it off. All of the non-selected lines have potentials applied to them insufficient to change the state of any other thyristors.

The selected thyristor is read a positive potential to the row line and a lower potential to the column line. The difference between the positive potential and the lower potential is sufficient to pull the column line to a higher potential if the selected thyristor was programmed on, but insufficient to cause the thyristor to pull the column line to a higher potential if the selected thyristor was programmed off. Potentials applied to the non-selected row and column lines are insufficient to change their data. Maintaining potentials on the row and column lines sufficient to keep thyristors that are on turned on, but insufficient to turn on thyristors that are off, retains the stored data in the array.

A technique for reducing current in a row line to be accessed for an operation is also provided. The memory cells coupled to a row line are divided into groups and the column lines for performing operations on the memory cells are carried out by applying the necessary potentials for that operation to only one group at a time. All other column lines are maintained at a lower potential. The operation is then performed and the next group selected.

A method for refreshing the memory array consists of dividing the array into sectors and refreshing it on a sector-by-sector basis, e.g. by providing a refresh line to apply current or voltage pulses to the sector by switchably connecting only those row lines in the sector to be refreshed to the refresh line.

Because the on thyristors dissipate power, power consumption in the array can be controlled by using parity bits to more closely balance numbers of on and off thyristor memory cells. For example two parity bits can define four states for a stored word that represent not changing the stored word, inverting the first four bits of the stored word, inverting the last four bits of the stored word, and inverting all of the stored word. This approach allows the stored words on average to have approximately the same number of on and off thyristors.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 3A-9A are cross sectional views illustrating a process for manufacturing the memory cell of FIG. 1 showing the cross-sections along line A~A' from FIG. 2B.

FIGS. 3B-9B are cross sectional views illustrating a process for manufacturing the memory cell of FIG. 1 showing the cross-sections along line from FIG. 2B.

FIGS. 15A-15B illustrate a thyristor memory cell with an NMOS sidewall gate in a trench adjacent the thyristor; FIG. 15A shows a lateral cross-sectional view of the cell and FIG. 15B shows a longitudinal cross-sectional view of the cell.

FIGS. 17A-17B illustrate a thyristor memory cell PMOS sidewall gate in a trench adjacent the thyristor; FIG. 17A shows a lateral cross-sectional view of the cell and FIG. 17B shows a longitudinal cross-sectional view of the cell.

FIGS. 19A-19B illustrate a method of rolling word line access to reduce row current; FIG. 19A shows one step of the method in which a first group is selected for access and FIG. 19B show the next step in which a second group is selected for access.

DETAILED DESCRIPTION OF THE INVENTION

1. An Individual Memory Cell

Figure 1A:
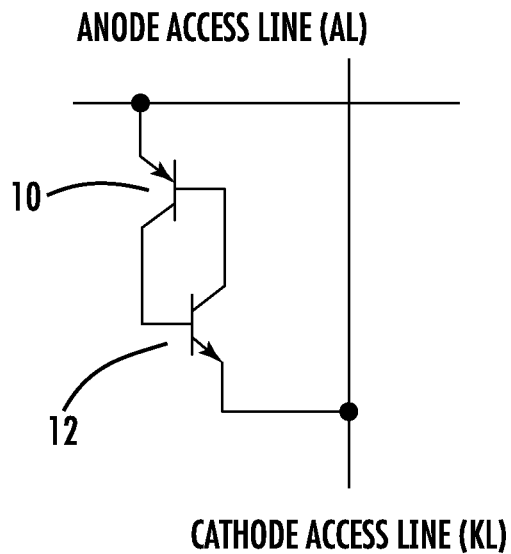
FIG. 1A is a circuit schematic of a single thyristor memory cell.
Figure 1B:
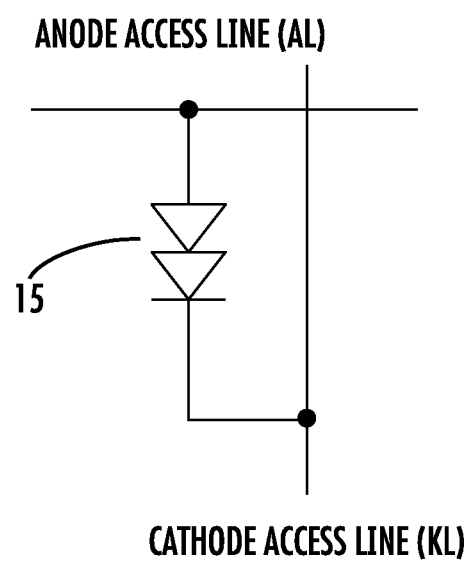
FIG. 1B is an equivalent circuit schematic as used in the figures herein.

This invention provides a thyristor-based volatile memory cell, methods of manufacturing the cell, and methods of operating an array of such cells. The memory cell has particular utility for use in dynamic random access memory (DRAM) integrated circuit, as well as circuits in which DRAM memories are embedded. FIG. 1A is a circuit schematic of a thyristor coupled between an anode access line (AL) and a cathode access line (KL). The thyristor consists of two cross-coupled bipolar transistors 10 and 12. The emitter of PNP transistor 10 is coupled to the anode access line, while the emitter of NPN transistor 12 is coupled to the cathode access line. The collectors and bases of the two transistors are coupled together as shown. FIG. 1B is an equivalent circuit schematic showing the thyristor 15 using conventional notation. This notation is used in subsequent figures below.

Figure 2A:
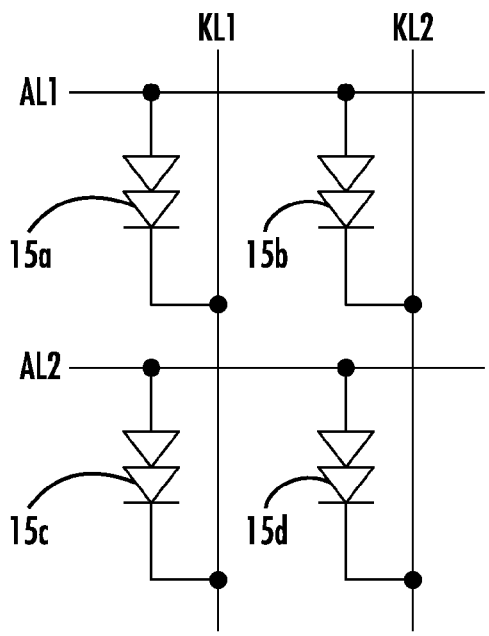
FIG. 2A is a circuit diagram of a 2×2 memory cell array.

FIG. 2A illustrates an array of four thyristors 15a, 15b, 15c, and 15d coupled in a grid pattern to form a memory array. Thyristors 15a and 15b are connected to the same row line AL1, but to different column lines KL1 and KL2. Similarly, thyristors 15c and 15d are connected to the same row line AL2, but to different column lines KL1 and KL2.

Figure 2B:
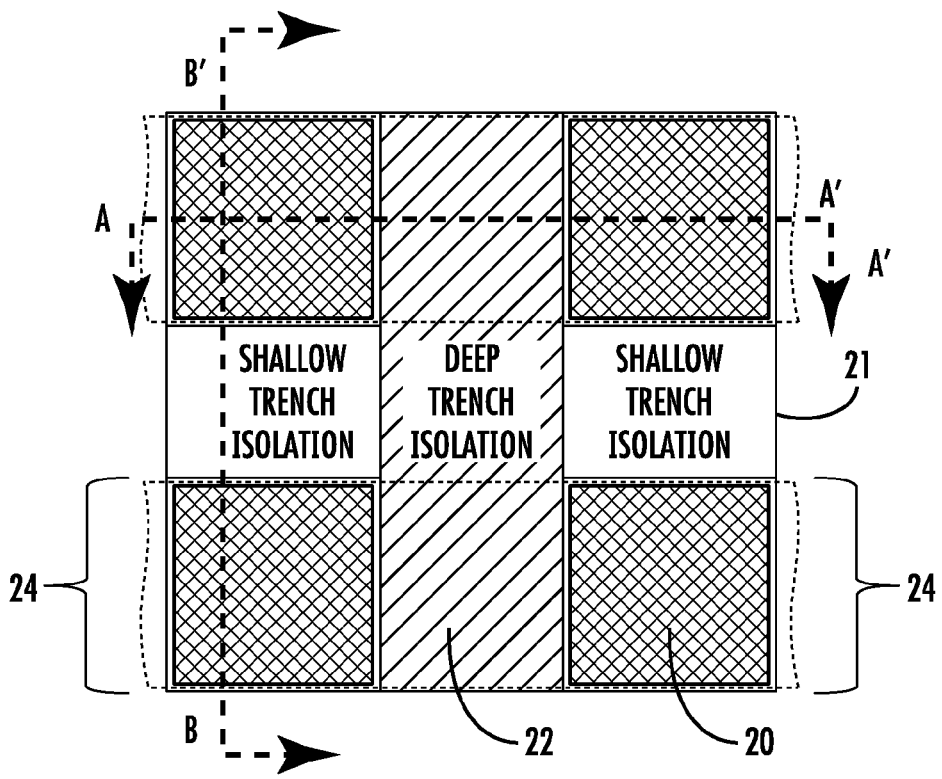
FIG. 2B is a layout diagram showing the topology of the 2×2 memory cell array as implemented in an integrated circuit.

FIG. 2B is a layout diagram illustrating the layout of the circuit shown in FIG. 2A as an integrated circuit. The four thyristors are vertical thyristors, having anodes 20 at the corners of the layout. A deep silicon dioxide trench 22 isolates the thyristors on the left from those on the right, while a shallow trench 21 isolates the upper thyristors from the lower ones. These trenches are shown below in more detail. A conductive line 24 provides a row line for the memory array, and is coupled to the anodes of the thyristors. A similar row line (not shown) extends across the anodes of the thyristors in the row above row line 24. The figure also shows the locations of cross-sections A~A' and B~B' used in subsequent figures below.

2. The Fabrication Process

FIGS. 3A and 3B are illustrations used to describe the beginning of the process for fabricating the structure shown in the top view of FIG. 2B. In the first step of the process selected regions of the P-conductivity type silicon substrate 30 are doped with an N-conductivity type dopant, for example, arsenic, to a concentration that ranges from $1\times10^{19}$ to $5\times10^{20}$. The semiconductor substrate layer 30 can include single crystalline semiconductor materials such as silicon or silicon-germanium alloy. The N-conductivity type dopant 32 is introduced by well known semiconductor fabrication techniques, for example, ion implantation, and extends into the substrate 30 as illustrated to a depth of 200 nm-500 nm. Because the entire cell array region is open to this buried N-type doping, there is no difference between the two cross-sectional views of FIGS. 3A and 3B.

Next, as shown in FIGS. 4A and 4B, an epitaxial silicon layer 35 with a thickness between about 300 nm and 500 nm is formed on top of the underlying structure, also using well-known semiconductor fabrication process technology. The epitaxial layer 35 can be either intrinsic, or in-situ doped to a P-conductivity type.

FIGS. 5A and 5B illustrate the next steps of the process. First, a thin silicon dioxide (pad) layer 36 is grown or deposited across the upper surface of the semiconductor structure. On top of layer 36, a silicon nitride layer 38 is formed using well-known process technology. Using a mask (not shown), openings are etched through the silicon nitride layer 38 and the pad oxide layer 36 to expose the upper surface of the epitaxial layer 35 where deep trenches 39 are to be formed. Using the patterned pads as a hard mask with or without photoresist removal, a reactive ion etch (ME) step is then performed to etch the deep trenches 39 that extend through the memory cell area, e.g. as shown in the top view of FIG. 2B. These deep trenches extend down through the overlying layers to the substrate 30. Notice that the deep trenches are parallel to each other and thus do not appear in the cross-section illustrated in FIG. 5B.

As next shown in FIG. 6A, the deep trenches 39 are filled with insulating material such as silicon dioxide 42. This is achieved by first growing a thin liner-oxide on the exposed silicon surface of the sidewalls and bottoms of the trenches. Then using, for example, high-density plasma (HDP) enhanced chemical vapor deposition (CVD), the trenches are filled with silicon dioxide to an appropriate thickness, typically extending above the upper surface of the structure. Next, well-known chemical mechanical polishing (CMP) with high-selectivity slurry is used to planarize the surface and remove the excess trench oxide down to the pad nitride. Then, as shown in FIG. 6B, another masking step is performed and shallower trenches 40 are etched. Note that the depth of the shallower trenches extends to the N-conductivity type epitaxial layer 32, and not down to the P-type substrate.

Next, as shown in FIG. 7B, the shallower trench is oxidized and then filled with silicon dioxide 45, in the same manner as described above. After the trench is filled with silicon dioxide and planarized by CMP, the upper layers of silicon dioxide and silicon nitride are etched away, again using conventional wet or dry etching.

FIGS. 8A and 8B illustrate the next steps of the process. Ion implantation steps are used to introduce P-conductivity type 52 and N-conductivity type 54 impurities into the upper surface of the semiconductor creating the PNPN thyristor structure. The N-conductivity type impurity is preferably arsenic, while the P-conductivity type impurity is preferably boron, e.g. boron difluoride. After formation of region 52, a refractory metal, such as titanium, cobalt, or nickel, is deposited on to the upper surface. A rapid-thermal anneal (RTP) is then performed to create a conductive metal silicide in semiconductor regions such as region 50 to provide an ohmic contact to the anode 50 of the thyristor. The un-reacted metal is then removed by a wet etch. The buried N-type region 32 provides the cathode connection.

Also shown in FIG. 8B are conducting lines 58 which provide the row lines connecting the anodes of the thyristors of a row together. These conductors that can be metal, metal silicide or doped polysilicon are formed using well-known semiconductor fabrication techniques. For simplicity the row line conductors are only shown in FIG. 8B, and not in subsequent figures here.

FIGS. 9A and 9B illustrate an alternative embodiment for the anode structure 56. As shown, a raised source/drain technology can be used to form the anode by selective epitaxial growth of silicon on the upper surface of the structure. This P-type region 52 can be doped in-situ or using a masking and implantation step. As per the previous embodiment, a refractory metal and an annealing step can be used to form the anode electrode. The raised source/drain technology provides the advantage of allowing a shallower trench, yet still enabling additional space for the N- and P-regions 54 and 35 respectively.

Figure 10:
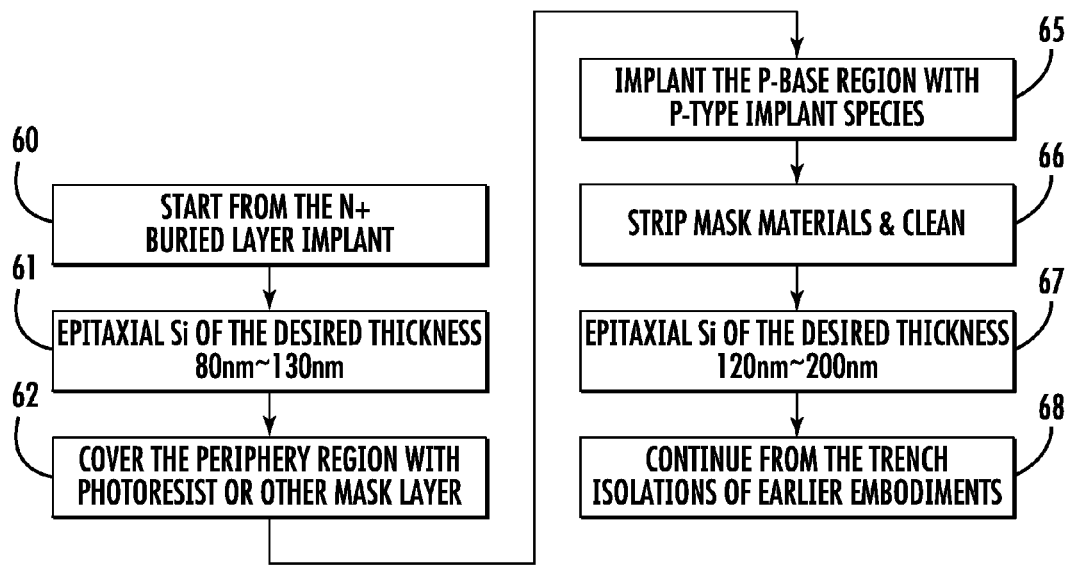
FIG. 10 is a flow chart illustrating an alternative process to the process of FIGS. 3A-9A and FIGS. 3B-9B.

FIG. 10 is a flowchart illustrating an alternative embodiment for manufacture of a vertical thyristor. One possible disadvantage of the methods described above for making the vertical thyristor is that the implanted P-type base and N-type base regions (regions 52 and 54 in FIGS. 8A-8B) may have peak concentration and thickness limitations resulting from higher energy implant ion scattering and channeling. FIG. 10 illustrates an alternative process for achieving potentially more desirable base doping profiles while maintaining a planar silicon surface.

The process begins with step 60—the buried layer N-type implant—as described with respect to FIGS. 3A-3B. Then in step 61, as shown in FIGS. 4A-4B, epitaxial silicon of a desired thickness, e.g. 80 nm-130 nm, is grown across the upper surface. Next in step 62, the peripheral region of the integrated circuit is masked with photoresist, or other material. Then in step 65 the P-type base region (region 35 in FIGS. 5A-5B) is implanted with appropriate dopant. The masking material is then removed from the wafer (step 66) and then another epitaxial layer of desired thickness, e.g. 120 nm-200 nm, is grown across the upper surface of the wafer, and doped N-type to form the N-type base region. Finally, the alternative process returns to formation of the trench isolation regions as described in FIGS. 5A-8A and 5B-8B above.

3. Operation of a Memory Cell Array

Figure 11A:
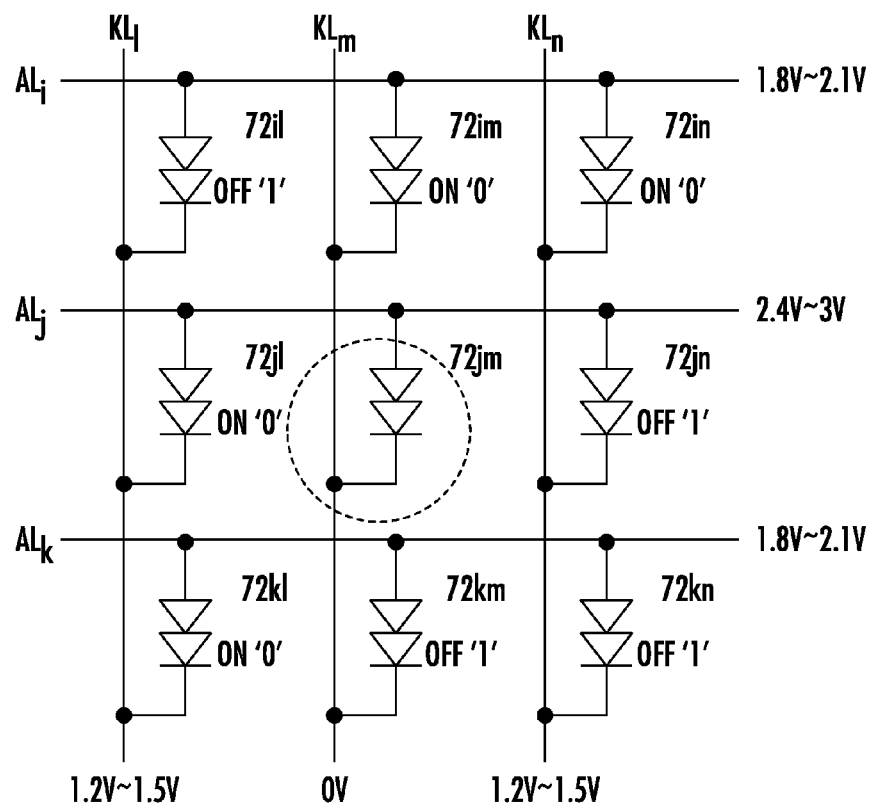
FIGS. 11A and 11B are diagrams illustrating the potentials applied to an array of memory cells when writing a '0' into a selected memory cell.

FIG. 11A illustrates a portion of a larger array of memory cells using the thyristors described above. The illustration will allow an explanation of the methods of operating a memory array of arbitrary size to read, write, refresh and otherwise operate the memory array. Even though a 3×3 array is shown, it should be noted that this invention is not restricted to any particular number of anode and cathode access lines or memory cells. In this exemplary memory array, individual memory cells 72 are each connected to an anode line AL and a cathode line KL. For example, memory cell 72kn is connected to anode line ALk and to cathode line KLn.

In FIG. 11A, as well as in the next series of figures, the "selected" memory cell for a memory array operation is the central cell 72jm. The goal of the operation described with respect to FIG. 11A is to write a bit of data (a logic '0') to the selected cell without disturbing the contents of the other memory cells. For illustrative purposes sample data stored in the other cells of the array is shown in the figure for each cell. For example cell 72im is 'on' storing a '0', while cell 72kn is 'off' storing a '1'.

Each anode and cathode line in FIG. 11A shows the voltage applied to that line to implement the desired operation—writing a logic state '0' (thyristor 'on') to cell 72jm. It should be noted that voltage ranges described here are for illustrative purposes only because the precise voltages used in a particular implementation depend upon the actual geometrical design and also the precise doping concentrations for meeting the target product specification. In addition, each of the voltage levels can be shifted up or down as long as the voltage differential between anode and cathode lines remains the same.

To write a '0', the non-selected anode lines ALi and ALk are held at a potential on the order of 1.8-2.1 volts while the selected anode line ALj is raised to 2.4-3 volts. The non-selected cathode lines KL1 and KLn are held at 1.2-1.5 volts, while the selected cathode line KLm is pulled down to ground potential. The effect of these potentials is to apply a potential of 2.4-3 volts across the anode and cathode of selected thyristor 72jm, which is sufficient to turn it on, representing a '0' state. All of the cells at non-selected ALs and non-selected KLs have a potential between their anodes and cathodes of about 0.6 volts, which is designed to be the standby or hold voltage, leaving the data stored by those thyristors unchanged. For cells at a selected AL/non-selected KLs or a selected KL/non-selected ALs, a potential of 1.2V~2.1V is seen between their anodes and cathodes and its upper limit is determined by the trigger voltage from a '0' state to a '1' state.

Figure 11B:
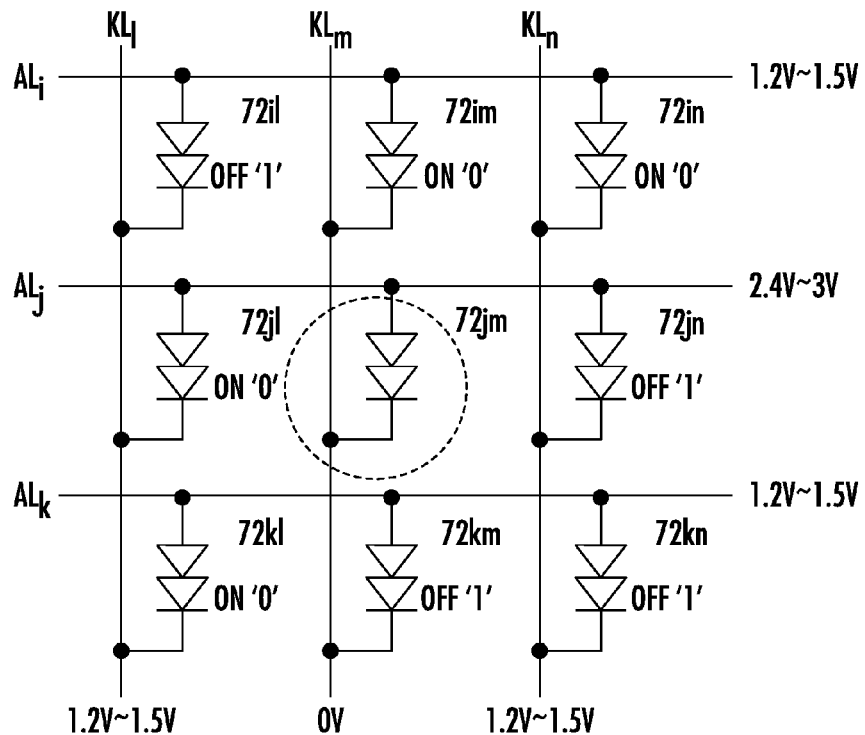

One potential disadvantage of the write '0' bias scheme of FIG. 11A is the sneak leakages from the '0' cells (72im and 72jl) on selected ALj or KLm because the voltage differential across their anode and cathode is higher than the standby voltage. In yet another embodiment, FIG. 11B shows an alternative write '0' operation which employs a half-select scheme. In this alternative approach, all non-selected ALs and KLs are biased at half of the selected anode voltage level. As a result, cells at non-selected ALs and non-selected KLs are biased at 0 volts across their respective anode and cathode.

Figure 12:
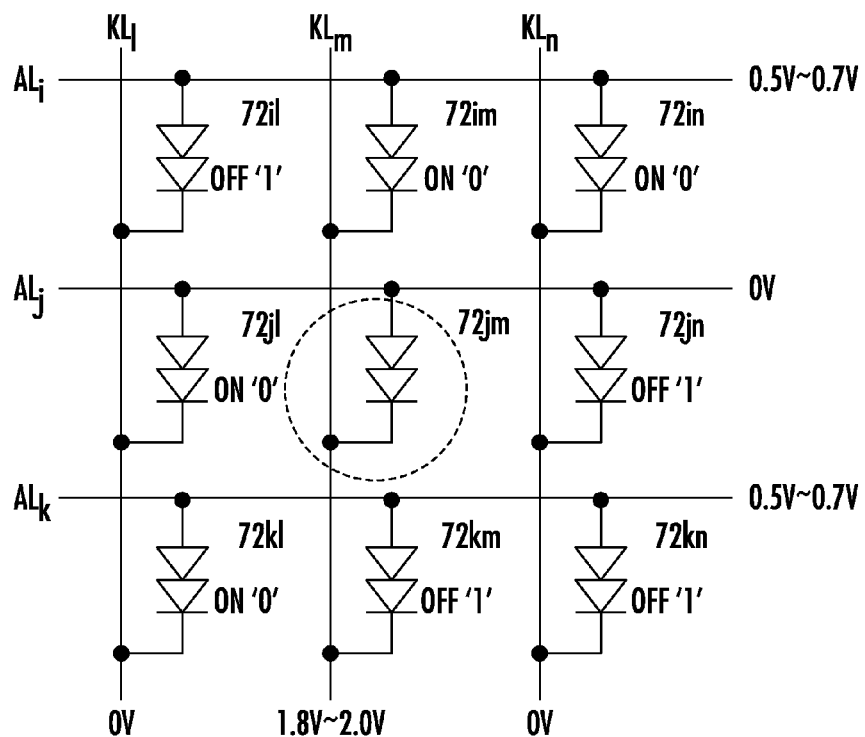
FIG. 12 is a diagram illustrating the potentials applied to an array of memory cells when writing a '1' into a selected memory cell.

FIG. 12 is a circuit schematic of the exemplary array of memory cells using the same notation as in FIGS. 11A and 11B to illustrate the potentials for writing a logic '1' to the selected memory cell 72jm. The potentials on the various anode and cathode lines to write a '1' on thyristor 72jm are shown. The non-selected cathode lines KL1 and KLn are held at ground potential, while the non-selected anode lines are held at a potential of 0.5-0.7 volts. In a first embodiment, the selected cathode line is raised to 1.8-2.0 volts and the selected anode line is pulled to ground potential. Alternatively, potentials at ALs and KLs can be level shifted for the benefit of decoder and driver designs. For example, bias voltage on selected ALj and non-selected KLs can be raised from 0V to 0.6V and bias voltages on selected KLm and non-selected ALs are also increased by 0.6V.

Figure 13A:
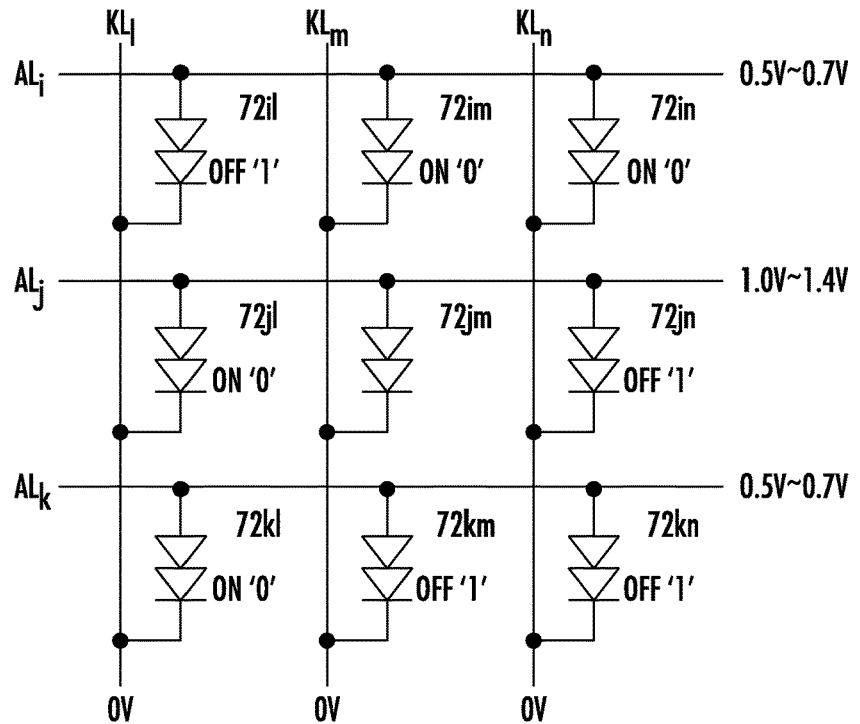
FIGS. 13A and 13B are diagrams illustrating the potentials applied to an array of memory cells when reading a selected memory cell.

FIG. 13A is a circuit schematic of an array of memory cells using the same notation as in FIG. 12 to illustrate the potentials on the anode and cathode lines for reading the logic state of a memory cell. In this case the non-selected anode lines Ali and ALk are held at a potential of 0.5-0.7 volts, while all the cathode lines, both selected and non-selected, are grounded. The selected anode line is raised to 1.0-1.4 volts.

If the selected thyristor 72jm was previously programmed 'on', i.e. a logic state of '0', then the applied potential between its anode and cathode will turn it on and pull cathode line KLm to a higher potential. A well-known sense amplifier coupled to cathode line KLm detects this rise in potential. The increase in potential is interpreted as indicating the thyristor was at a logic state of '0'. On the other hand, if the selected thyristor 72jm was previously programmed 'off', i.e. a logic state of '1', then the applied potential between its anode and cathode will not be sufficient to turn it on. In this case the sense amplifier will not detect any rise in potential of cathode line KLm. The absence of change in the potential of the cathode line is interpreted as indicating the thyristor was at a logic state of '1'. Alternatively, the logic state of a selected memory cell can also be sensed from the anode line because the same current flows into the anode and comes out of the cathode.

Figure 13B:
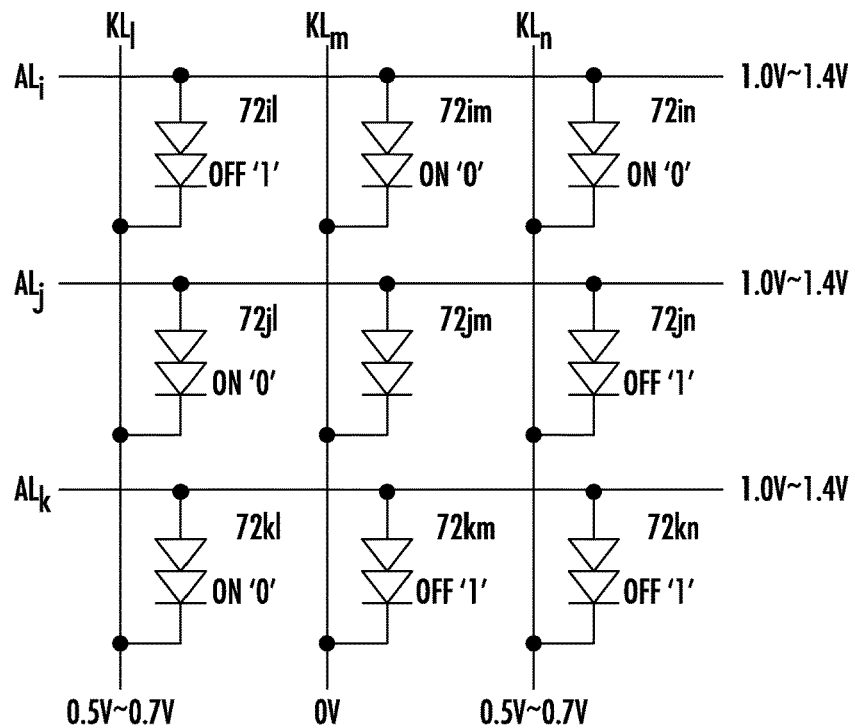

FIG. 13B shows another embodiment for reading the stored logic state in the memory cells. In this approach an entire column is read in one cycle. Non-selected cathode lines (KLs) are biased at 0.5-0.7V or their standby levels and selected anode lines are pre-charged to a pre-determined read voltage level above the standby voltage. An exemplary range is 1~1.4V which drives sufficient cell current through cells storing '0' data. Sense amplifiers coupled to selected ALs detect any potential drops for the '0' logic states. Conversely, logic state '1s' are detected if cells on selected anode lines are previously programmed 'off'. Therefore there is no potential drop due to non-conducting cells. If it is desired to read only a limited number of cells in the column, then the non-selected ALs are biased at 05-0.7 v thereby reducing the leakage.

Figure 14:
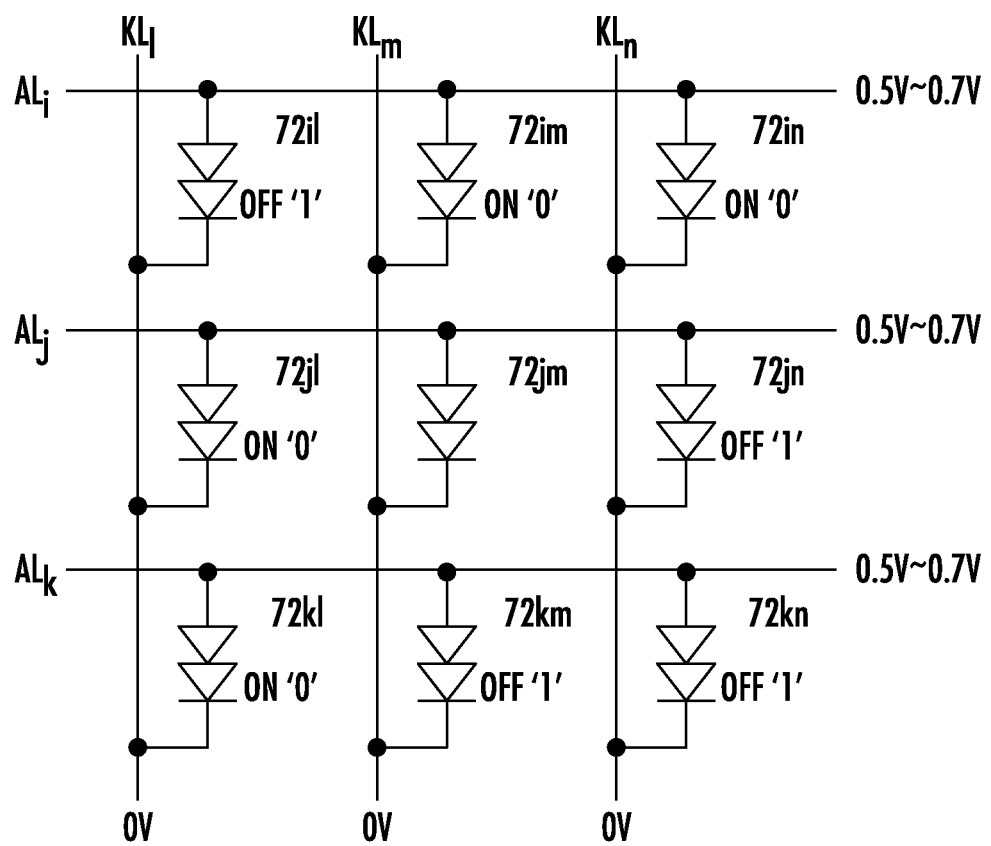
FIG. 14 is a diagram illustrating the potentials applied to an array of memory cells to retain data stored in the memory cells.
Figure 22A:
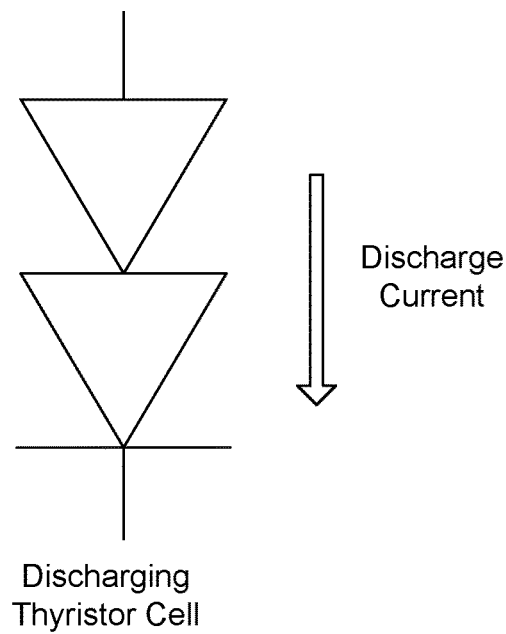
FIG. 22A is a representation of a current through an 'on' thyristor cell as it discharges and FIG. 22B is a representation of a current through the 'on' thyristor cell as it is refreshed.
Figure 22B:
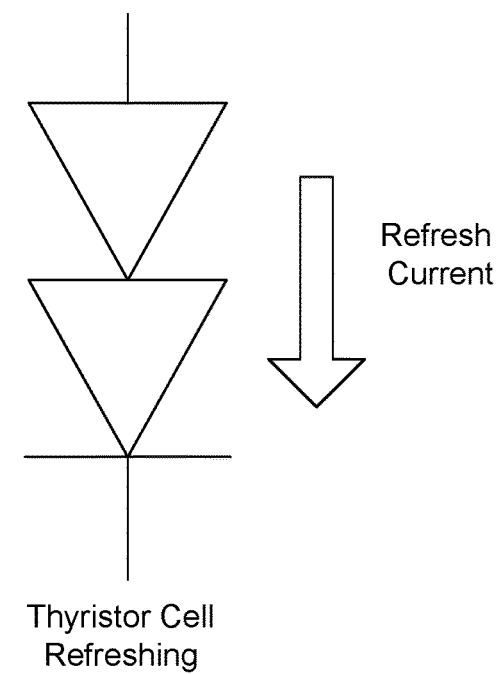

Individual thyristors in an array will, over time, gradually lose their stored data due to leakage currents. While this leakage is substantially less than occurs in a conventional one-transistor one-capacitor DRAM memory cell, to overcome the leakage current, the array can be placed in a standby state so that the stored data is retained. FIG. 14 illustrates the potentials applied to the anode and cathode lines to retain the stored data in an array of thyristor memory cells. In this state all anode lines are held at 0.5-0.7 volts and all cathode lines are grounded. In this condition the 'off' thyristors are not affected, while the 'on' thyristors are continuously charged to the 'on' state. Because this standby state continuously consumes power, there is a trade-off between maintaining the thyristors in standby versus allowing discharge and periodically refreshing the array. FIG. 22A shows current through discharging 'on' thyristor and FIG. 22B shows refreshing current through the 'on' thyristor. In our preferred implementation, we refresh the entire array from 1 to 10 times per second. This is far less frequent than a conventional FET based DRAM requires refreshing—a particular advantage of this invention.

FIGS. 15A and 15B illustrate another embodiment of the thyristor memory cell of this invention. In this embodiment sidewall NMOS gates 80 are added to the deep trenches of the structure. The remaining regions of the structure are the same as described above with regard to FIGS. 4A-8A and 4B-8B. The benefit of adding gates 80 is to increase write speed and reduce write voltage. Because addition of the gates increases process complexity, use of the gates is dependent on the particular application expected for the memory array.

The gates 80 may be formed in the deep trenches by first performing the deep silicon etch as described above with regard to FIGS. 5A-5B. The sidewalls of the trench are then oxidized—thereby forming the gate oxide that isolates the gate electrodes from the doped regions 32, 59, and 57. The trenches are then partially filled with silicon dioxide, e.g. by a chemical vapor deposition process. Then a conformal-doped polycrystalline silicon layer is deposited across the structure. After an anisotropic etching step removes the entire conformal polycrystalline silicon layer except as shown in FIG. 15A, another trench filling operation is performed to finish filling the trenches. Appropriate planarization steps are then performed, e.g. using chemical mechanical polishing or other techniques. Later in the process an electrical connection is made to couple the gates 80 to control gate lines (GLs).

Figure 16:
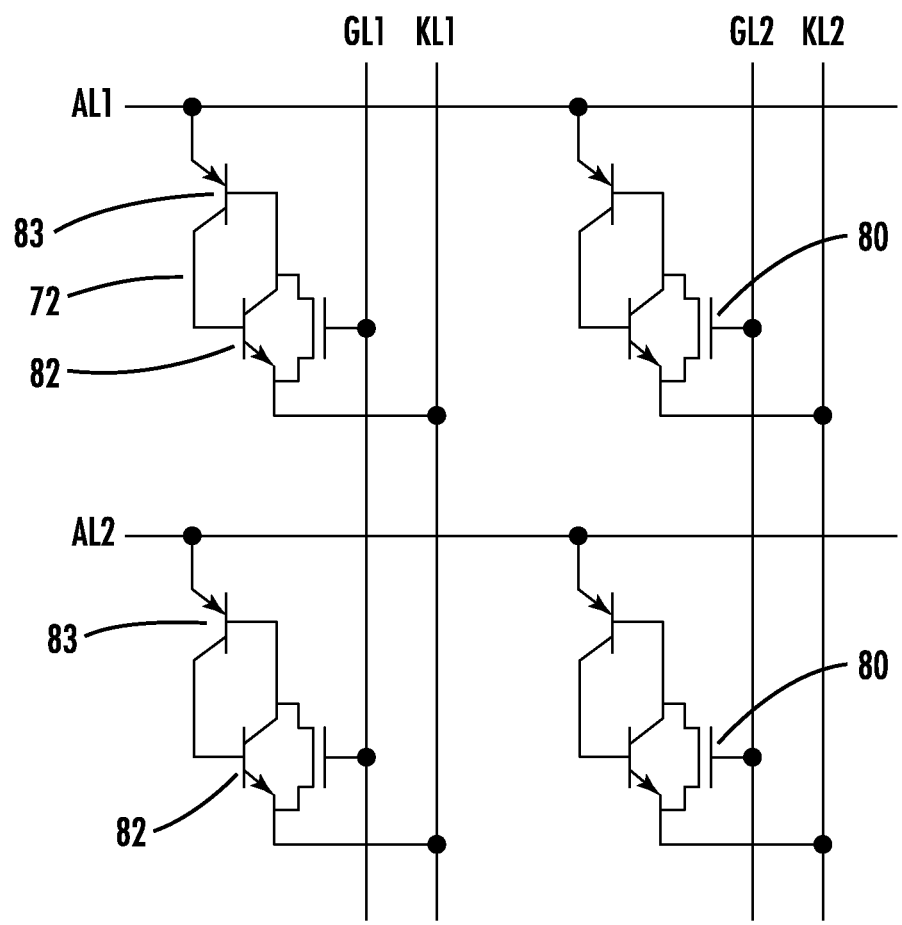
FIG. 16 is a circuit schematic illustrating an array of cells using the gate shown in FIG. 15A-B.

FIG. 16 is a circuit schematic showing an array of thyristor memory cells 72 with the addition of gates 80 as described above. The gates 80, when turned on by gate line GL, short out the NPN transistor 82 connecting the base of the PNP transistor 83 to the cathode line KL. This approach has the advantages described above—reducing the write voltage and allowing faster writes of data.

FIGS. 17A-17B illustrate another embodiment of vertical thyristor cell with two sidewall PMOS gates 86 in the deep trenches. These are formed in the same manner as gates 80 described above. The buried gates 86 can be connected at the pick-up regions and coupled to gate lines (GLs). These gates are formed in the same manner as described above. After a deep silicon trench-etching step, the trench gate oxide is formed. The trench is then partially filled with silicon dioxide to a depth above the N-cathode/P-base junction. A conformal conductive gate layer of, e.g. doped polycrystalline silicon is then formed. The gate layer is then anisotropically etched to form a sidewall gate completely covering the N-type base. Finally the trench is filled with silicon dioxide and then planarized, using well know technology.

Figure 18:
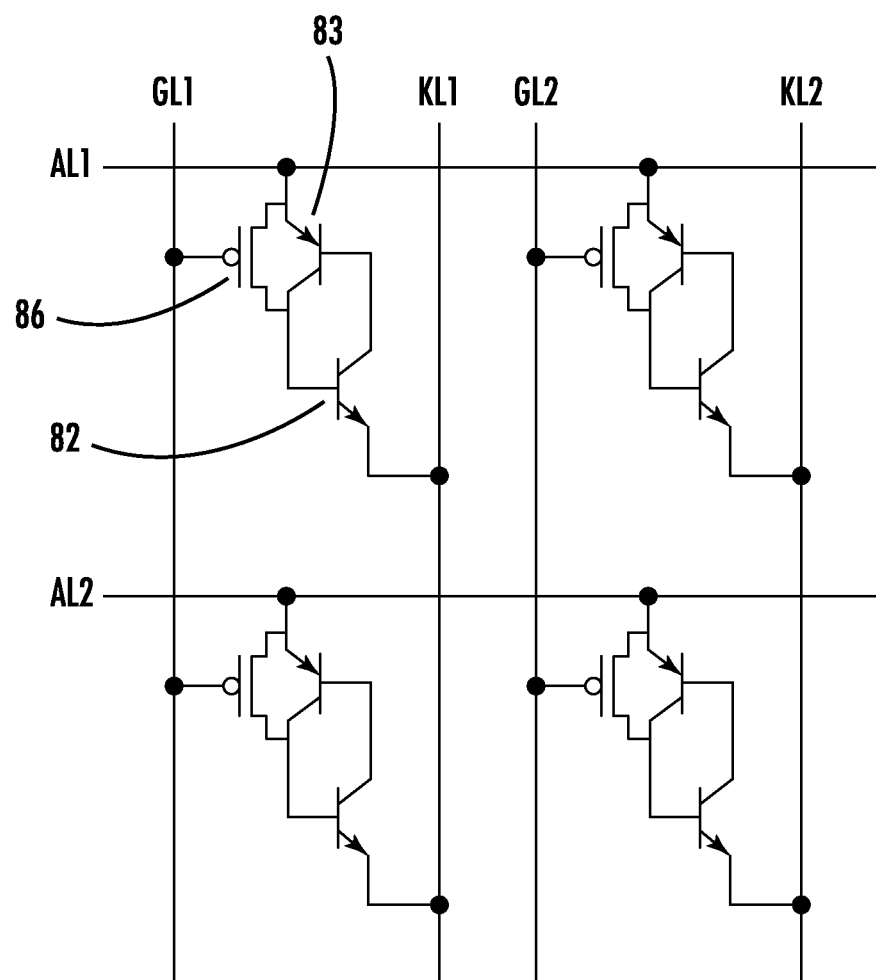
FIG. 18 is a circuit schematic illustrating an array of cells using the gate shown in FIGS. 17A-17B.

FIG. 18 is a circuit schematic of a memory array in which the PMOS gates 86 of FIG. 17A are used. The gates 86, when turned on by gate line GL, short out the PNP transistor 83 connecting the base of the NPN transistor 82 to the anode line AL. This approach has the same advantages as discussed above for the NMOS gates.

One potential issue with respect to using an array of thyristors as memory cells is the requirement for higher row currents during access operations to read the memory cells. (Here we use the word 'row' as synonymous with anode, and 'column' as synonymous with cathode. Word line and bit line could also be used.) To reduce the need for higher row currents we use a technique we refer to as rolling the word line. This approach is described in conjunction with FIGS. 19A-19B.

FIG. 19A shows a row of thyristor memory cells in a memory array. The row consists of N columns of memory cells that are divided into M groups of cells. One group of 4 cells is shown at the left end of the row. The use of 4 cells for a group is merely an example; in an actual integrated circuit many more than 4 cells will be in a group. To access the cells, e.g. for reading data from them or writing data to them, a voltage VSelected is applied to the column lines of all members of the group. All of the other column lines receive a potential of VHold, where VHold is higher than VSelected. The result is that the selected group will have a current of:

I group selected=M*I Selected where I Selected is the current for one cell

The remaining N/M−1 groups of cells in the row will have a current of:

I group hold=(N/M−1)*M*I hold where I Hold is the current for one cell

In use of the memory array, the procedure is to apply the selected potential for the desired operation to the first group while biasing all remaining groups to 'hold.' Once the desired operation on the first group is finished, the bias on the first group is changed to 'hold' and the bias on the next group is changed to the selected potential, such as shown by FIG. 19B. By repeating these steps of holding all groups of cells on a word line at the 'hold' potential except the selected group, and repeating this group-by-group, the row current is reduced. We refer to this technique as 'rolling' the word line.

For memory cells with highly non-linear current versus voltage relationships, the holding current for a cell can be orders of magnitude lower than the selected cell read current. For example, assume a row has 128 columns divided into 8 groups, each group having 16 cells. In a typical implementation the select current will be about 10 uA, while the hold current will be about 10 pA, that is a factor of six orders of magnitude. Therefore:

Without rolling: I row=128*10 uA=1.28 mA

With rolling: I row=16*10 uA+(128−16)*10 pA=160 uA

Thus rolling the word line in the manner described provides an 88% reduction in word line current, and 8 rolling accesses to access the complete row.

Because each thyristor cell in a memory array that is 'on' will dissipate some current, current consumption by the memory array, and the number of such 'on' cells depends on the particular data being stored in the array. This has the undesirable effect of linking power consumption to the actual data stored in the memory. Data encoding with an objective of maintaining approximately 50% of the cells as logic '1' can be used to reduce this standby current.

For example, consider an 8-bit word with 2 additional parity bits.

Parity=00 no change

Parity=01 invert lower 4 bits

Parity=10 invert upper 4 bits

Parity=11 invert all bits

In the following examples the parity bits are the first two bits preceding the stored word of data and are in italics.

EXAMPLE 1 all ones: 1111_1111 becomes 10_0000_1111, thus 8 ones become 5 ones.

EXAMPLE 2

50%+1 one: 1010_1011 becomes 01_1010_0100, thus 5 ones become 4 ones.

EXAMPLE 3

50% ones: 1010_1010 becomes 00_1010_1010, thus 4 ones become 4 ones.

EXAMPLE 4

50%-1 ones: 0010_1010 becomes 00_0100_1010, thus 3 ones become 3 ones.

EXAMPLE 5 all zeros: 0000_0000 becomes 10_1111_0000 thus 0 ones become 5 ones.

EXAMPLE 6

5 ones: 0011_1011 becomes 11_1100_0100 thus 5 ones become 3 ones.

The above data encoding techniques, or other similar approaches, are useful where the array standby current is to be maintained at a relatively constant level, and used for a current source controlled standby operation. Conventional logic circuitry can be used to detect the number and position of the ones, perform the desired inversions (or not) and add the parity bits to the stored data.

In the embodiment associated with FIG. 14, data stored in the thyristor memory array are maintained in standby by supplying a hold voltage or current so that refresh is not needed. Under these standby conditions, all memory cells holding '0' data conduct a very low, but finite current. Due to the exponential relationship between hold current and hold voltage, it is advantageous to use a current source to keep cells alive in standby. One approach is described in our earlier patent applications, for example, U.S. patent application Ser. No. 14/590,834 entitled "Cross-Coupled Thyristor SRAM Circuits and Methods of Operation," filed Jan. 6, 2015, which is incorporated herein by reference. There we described a technique of maintaining data retention at a low standby current using a constant current source to bias the array to the optimum holding voltage. While this approach was discussed in conjunction with SRAM memory, it can also be used with other thyristor-based volatile memories such as the ones described here.

Figure 20:
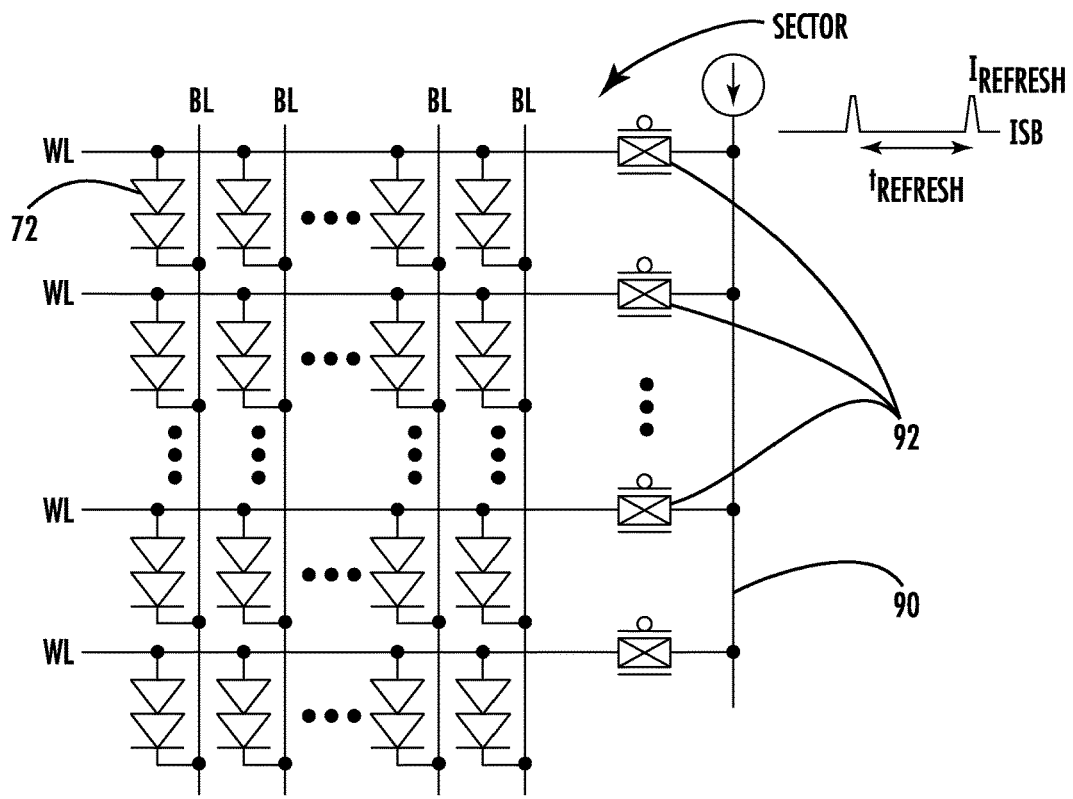
FIG. 20 is a circuit schematic illustrating a method of refreshing data stored in a sector of the memory.

Under bias schemes described above, all memory cells holding '0' data conduct a very low but finite current in order to maintain the array data without the need for refresh. An alternative approach is to adjust the current provided to an even lower value that is not sufficient to maintain the data integrity indefinitely, but which is sufficient to maintain it for a minimum "retention" period—e.g. 1 msec. This approach allows a significant reduction in the standby current. To maintain the integrity of the data indefinitely, however, a background refresh operation is performed on a sector by sector basis where the set holding current for a sector is increased to a higher value for a short period to re-establish the cell levels to a better value, but then reduced back to the normal standby current. This allows all the cells in the sector to be refreshed simultaneously, rather than on a row-by-row basis as is currently done with conventional DRAMs. Further, the refresh does not interfere with normal read/write operations, making the refresh operation externally invisible. This approach is shown in FIG. 20.

The figure illustrates how one refresh pulse can refresh an entire sector. The refresh pulse applied to line 90 when the CMOS switches 92 are on will refresh the sector of memory cells 72. This example illustrates current controlled standby/refresh, however, the same approach can be applied to voltage-controlled standby/refresh.

Figure 21:
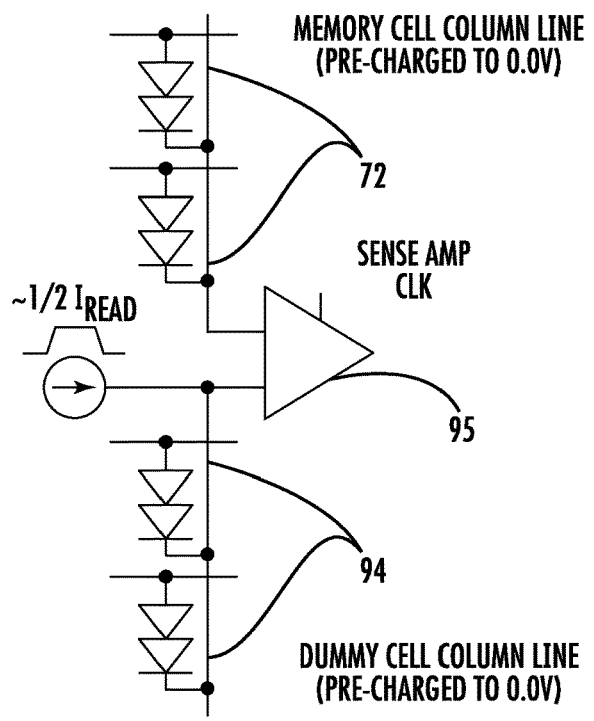
FIG. 21 is a circuit schematic illustrating a method of sensing a memory cell using a dummy bit line.

FIG. 21 is a circuit schematic illustrating one technique for reading data from the thyristor array. A sense amplifier 95 has one input connected to a column of memory cells 72 of the memory array. The other input of the sense amplifier 95 is connected to a column of dummy memory cells 94. The memory cells 72 and the dummy cells 94 have the column lines pre-charged to 0 volts. During a read operation the state of a programmed memory cell 72 will shift the potential of the column line up if the cell is a '0' or leave it near 0 v if the cell is a '1'. The dummy memory cell's column line is shifted up by the current source at a rate ½ as fast as the column in selected array to generate differential data for the sense amplifier 95. If the selected cell is a '0', the selected column will rise above the dummy column. If the selected cell is a '1', the dummy column will rise above the selected column. The sense amplifier output can then be interpreted as a '1' or a '0' indicative of the stored data.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method of dynamically operating an array of vertical thyristor memory cells, the array intersected by a plurality of first and second lines, the first lines orthogonal to the second lines, each vertical thyristor memory cell having an anode coupled to one of the first lines and having a cathode coupled to the one of the second lines, the method comprising:

writing data into the vertical thyristor memory cells of the array, the written data stored as the vertical thyristor memory cells turned off or on, including setting a first voltage on a selected one of the first lines and a second voltage on a selected one of the second lines to apply a voltage differential in a range of 2.4-3 volts across the selected one first line and the selected one second line, and across a selected vertical thyristor memory cell at an intersection of the selected one first line and the selected one second line to turn on the selected vertical thyristor memory cell and setting a third voltage on non-selected first lines and a fourth voltage on non-selected second lines at half the voltage differential applied to the selected vertical thyristor memory cell to provide a voltage differential in a range about 0 volts of across the non-selected first line and the non-selected second lines, and across non-selected vertical thyristor memory cells at intersections of the non-selected first lines and the non-selected second lines to leave data stored on the non-selected vertical thyristor memory cells unchanged;

allowing the turned on vertical thyristor memory cells to discharge; and periodically refreshing all the turned on vertical thyristor memory cells in the array before loss of data so that the data stored in the memory cells of the array is maintained.

2. The method of claim 1 wherein the vertical thyristor memory cell refreshing step comprises refreshing the turned on vertical thyristor memory cells of the array from 1-10 times a second.

3. The method of claim 1 wherein the vertical thyristor memory cell array refreshing step comprises driving a current from the one of the first lines connected to the anode to the one of the second lines connected to the cathode of a turned on vertical thyristor memory cell in the array.

4. The method of claim 3 wherein a magnitude of the driven current is larger than a magnitude of a current in the turned on vertical thyristor memory cell immediately prior to the vertical thyristor memory cell refreshing step.

\* \* \* \* \*